(12) United States Patent
Nomura

(10) Patent No.: US 11,689,184 B2
(45) Date of Patent: Jun. 27, 2023

(54) RESONATOR DEVICE

(71) Applicant: SEIKO EPSON CORPORATION, Tokyo (JP)

(72) Inventor: Norio Nomura, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/700,605

(22) Filed: Mar. 22, 2022

(65) Prior Publication Data

US 2022/0311414 A1 Sep. 29, 2022

(30) Foreign Application Priority Data

Mar. 24, 2021 (JP) .............................. JP2021-049611

(51) Int. Cl.
*H03H 9/19* (2006.01)
*H03H 9/02* (2006.01)
*H03H 9/08* (2006.01)
*H03H 9/05* (2006.01)

(52) U.S. Cl.
CPC .......... *H03H 9/19* (2013.01); *H03H 9/02566* (2013.01); *H03H 9/0538* (2013.01); *H03H 9/08* (2013.01)

(58) Field of Classification Search
CPC .......... H03H 9/17; H03H 9/13; H03H 9/1021; H03H 9/0547; H03H 9/19; H03B 5/32
See application file for complete search history.

(56) References Cited

U.S. PATENT DOCUMENTS

| | | | |
|---|---|---|---|
| 7,514,852 B2 * | 4/2009 | Kasahara | H03H 9/0514 310/343 |
| 2014/0292151 A1 | 10/2014 | Kondo | |
| 2017/0272081 A1 * | 9/2017 | Chiang | H01L 23/345 |
| 2017/0373637 A1 * | 12/2017 | Kondo | H03H 9/08 |
| 2018/0278209 A1 * | 9/2018 | Obata | H03H 9/0547 |
| 2020/0186084 A1 * | 6/2020 | Arft | H03B 5/04 |

FOREIGN PATENT DOCUMENTS

| | | |
|---|---|---|
| JP | 2014-192674 | 10/2014 |
| JP | 2015-033065 | 2/2015 |
| JP | 2017-028360 | 2/2017 |
| JP | 2017-130861 | 7/2017 |

* cited by examiner

*Primary Examiner* — Jeffrey M Shin
(74) *Attorney, Agent, or Firm* — Rankin, Hill & Clark LLP

(57) ABSTRACT

A resonator device includes: a resonator element; a first package that accommodates the resonator element; and a second package in which the first package is accommodated and fixed. The first package includes a base substrate that has a first surface on which the resonator element is disposed and a second surface which is in a front-back relationship with the first surface, and that contains single crystal silicon, an integrated circuit that is provided on the first surface or the second surface and that includes a temperature sensor circuit and a heater circuit, and a lid that is bonded to the base substrate such that the resonator element is accommodated between the lid and the base substrate.

5 Claims, 6 Drawing Sheets

RESONATOR DEVICE

The present application is based on, and claims priority from JP Application Serial Number 2021-049611, filed Mar. 24, 2021, the disclosure of which is hereby incorporated by reference herein in its entirety.

BACKGROUND

1. Technical Field

The present disclosure relates to a resonator device.

2. Related Art

In the related art, as an example of a resonator device, there is known an oscillator in which a temperature of a resonator element or the like is stabilized by heating the resonator element or the like, and a resonance frequency is stabilized. For example, JP-A-2017-28360 discloses an oven-controlled crystal oscillator (OCXO) in which a resonator element, a heat generating element, and a circuit element serving as an oscillation unit are accommodated in a package made of ceramic or the like, and a stable resonance frequency is output.

However, in the resonator device described in JP-A-2017-28360, since one end of the resonator element is coupled to the heat generating element, it is difficult for heat of the heat generating element to be uniformly transferred to the entire resonator element, and a temperature difference occurs in the resonator element, which may deteriorate the accuracy of an oscillation frequency.

SUMMARY

A resonator device includes: a resonator element; a first package that accommodates the resonator element; and a second package in which the first package is accommodated and fixed. The first package includes a base substrate that has a first surface on which the resonator element is disposed and a second surface which is in a front-back relationship with the first surface, and that contains single crystal silicon, an integrated circuit that is provided on the first surface or the second surface and that includes a temperature sensor circuit and a heater circuit, and a lid that is bonded to the base substrate such that the resonator element is accommodated between the lid and the base substrate.

DESCRIPTION OF EXEMPLARY EMBODIMENTS

1. First Embodiment

First, a resonator device 1 according to a first embodiment will be described with reference to FIGS. 1 and 2.

Figure 1:
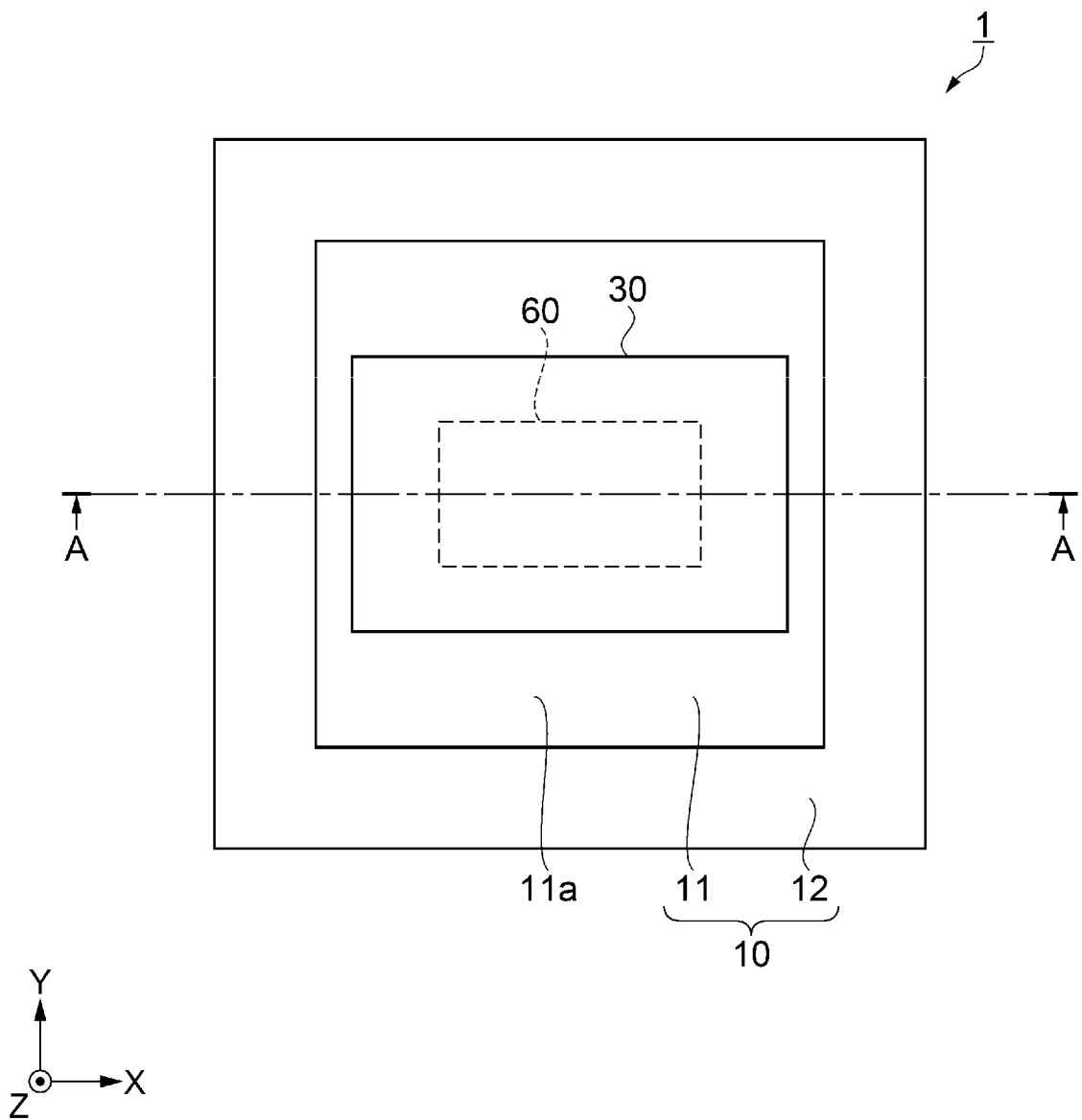
FIG. 1 is a plan view showing a schematic structure of a resonator device according to a first embodiment.

FIG. 1 shows a state in which a lid 16 is removed for convenience of description of an internal configuration of the resonator device 1. For convenience of description, in the following drawings except for FIG. 4, an X axis, a Y axis, and a Z axis are shown as three axes orthogonal to one another. A direction along the X axis is referred to as an "X direction", a direction along the Y axis is referred to as a "Y direction", and a direction along the Z axis is referred to as a "Z direction". An arrow side of each axis is also referred to as a "plus side", and a side opposite from the arrow is referred to as a "minus side". A plus side in the Z direction is also referred to as "upper", and a minus side in the Z direction is also referred to as "lower".

Figure 2:
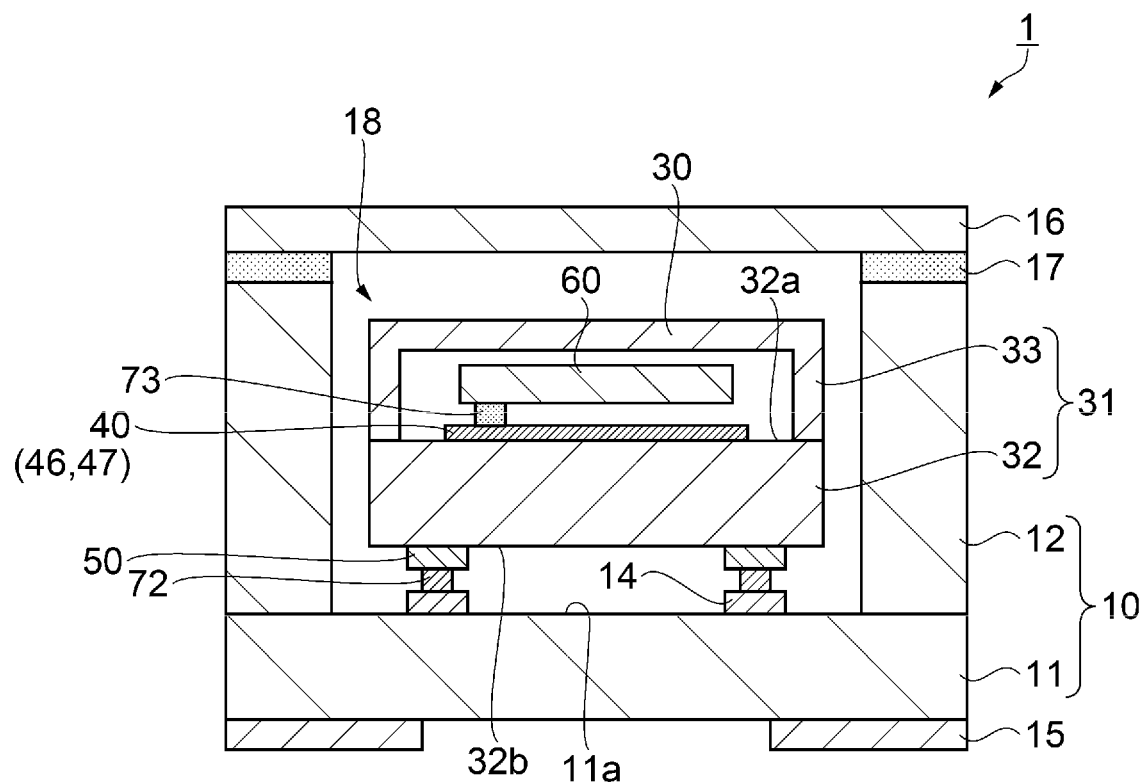
FIG. 2 is a cross-sectional view taken along a line A-A in FIG. 1.

As shown in FIGS. 1 and 2, the resonator device 1 includes: an oscillator 30 including a first package 31 that accommodates a resonator element 60; a second package 10 in which the first package 31 is accommodated and fixed; and the lid 16 that defines an internal space 18 between the lid 16 and the second package 10. Therefore, the resonator device 1 according to the present embodiment corresponds to an oven-controlled crystal oscillator (OCXO) having a double package structure.

The first package 31 includes a base substrate 32 and a lid 33, and accommodates the resonator element 60 between the base substrate 32 and the lid 33.

The base substrate 32 includes a first surface 32a on which the resonator element 60 is disposed and a second surface 32b that is in a front-back relationship with the first surface 32a. The first surface 32a of the base substrate 32 is provided with an integrated circuit 40 including a temperature sensor circuit 46, a heater circuit 47, and the like, and the resonator element 60 is fixed thereto via a conductive member 73 such as a metal bump. Therefore, a distance between the resonator element 60 and the temperature sensor circuit 46 or the heater circuit 47 is short, so that a temperature of the resonator element 60 can be detected with higher accuracy, and the resonator element 60 can be maintained at a constant temperature more stably. External coupling terminals 50 for bonding the first package 31 to the second package 10 are formed on the second surface 32b of the base substrate 32.

A constituent material of the first package 31 is a semiconductor material containing single crystal silicon, for example, silicon.

The second package 10 is formed by stacking a flat plate-shaped first substrate 11, and a frame-shaped second substrate 12. The second package 10 includes the internal space 18 that opens upward.

The first package 31 is accommodated in the internal space 18. The first package 31 is fixed on a bonding surface 11a, which is an upper surface of the first substrate 11, via conductive members 72 such as metal bumps. A state in which the first package 31 is fixed to the second package 10 means that coupling terminals 14 formed on the bonding surface 11a of the second package 10, to which the first package 31 is bonded, and the external coupling terminals 50 formed on the second surface 32b of the base substrate 32, which constitutes the first package 31, are respectively mechanically and electrically bonded via the conductive members 72.

External terminals 15 are formed on a lower surface of the second package 10. The external terminals 15 are respectively electrically coupled to the coupling terminals 14 formed on the first substrate 11 via through electrodes or wirings (not shown).

Examples of a constituent material of the second package 10 include various kinds of ceramics such as oxide-based ceramics, nitride-based ceramics, and carbide-based ceramics which have thermal conductivity lower than thermal conductivity of the first package 31. Therefore, since the thermal conductivity of the first package 31 is higher than that of the second package 10, the heat of the heater circuit 47 is more easily transferred to the entire first package 31, and an external temperature variation can be effectively prevented by covering the first package 31 with the second package 10 having low thermal conductivity.

The lid 16 has a flat plate shape and is bonded to the upper surface of the second package 10 via a bonding member 17. Accordingly, the internal space 18 is formed air-tightly between the second package 10 and the lid 16, and the first package 31 is accommodated in the internal space 18. The internal space 18 is in a depressurized state, preferably in a state closer to vacuum. Accordingly, convective heat transfer from the first package 31 to the second package 10 can be reduced, and the internal space 18 can be maintained at a constant temperature.

Figure 3:
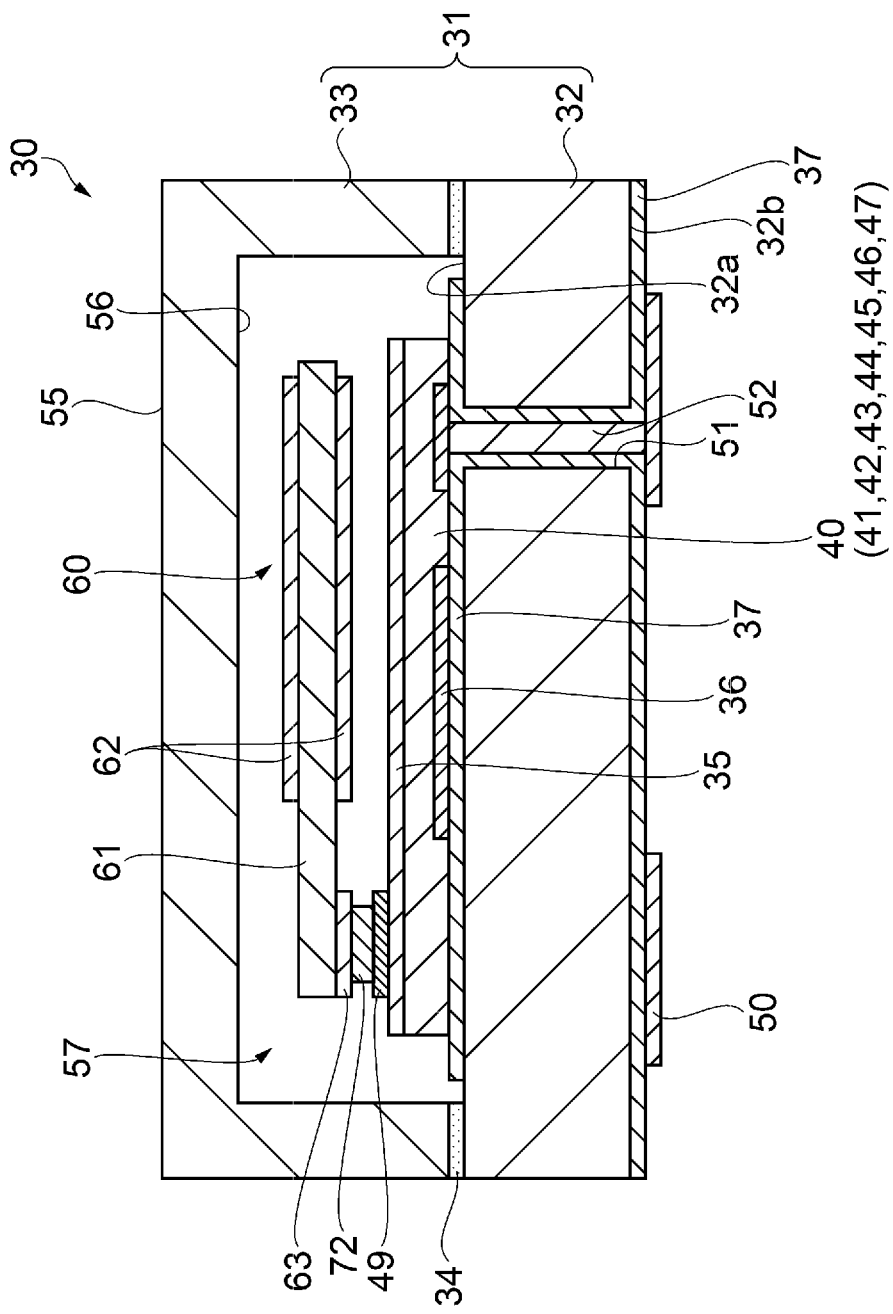
FIG. 3 is a cross-sectional view showing a schematic structure of an oscillator.

Next, a configuration of the oscillator 30 will be described with reference to FIG. 3.

The oscillator 30 according to the present embodiment is used as, for example, a temperature compensated crystal oscillator (TCXO) or an oven-controlled crystal oscillator (OCXO) having a single package structure. As shown in FIG. 3, the oscillator 30 includes the first package 31 including the base substrate 32 and the lid 33, and the resonator element 60 accommodated in an internal space 57 of the first package 31.

The first package 31 includes the base substrate 32 and the lid 33 bonded to the base substrate 32, and the resonator element 60 is accommodated in the internal space 57 formed between the base substrate 32 and the lid 33.

The base substrate 32 is a semiconductor substrate containing single crystal silicon, particularly, a silicon substrate in the present embodiment. The base substrate 32 is not particularly limited, and a semiconductor substrate other than a silicon substrate, for example, a semiconductor substrate such as a germanium substrate, a gallium arsenide substrate, a gallium phosphide substrate, a gallium nitride substrate, or a silicon carbide substrate may be used, or a substrate other than a semiconductor substrate such as a ceramic substrate may be used.

The base substrate 32 has a plate shape, and has the first surface 32a on which the resonator element 60 is disposed and the second surface 32b that is in a front-back relationship with the first surface 32a. An insulating film is formed on a surface of the base substrate 32. A wiring 36 is formed on the first surface 32a of the base substrate 32. The wiring 36 electrically couples functional elements such as the integrated circuit 40 electrically coupled to the resonator element 60, and the temperature sensor circuit 46 or the heater circuit 47 formed in the integrated circuit 40. However, the integrated circuit 40 and the wiring 36 may be formed on the second surface 32b instead of the first surface 32a of the base substrate 32.

A passivation film 35 is formed on the integrated circuit 40, and further, an internal coupling terminal 49 that is electrically coupled to the wiring 36 and that bonds the resonator element 60 is formed on the passivation film 35.

The external coupling terminals 50 for outputting a frequency signal or the like output from the integrated circuit 40 to the outside are formed on the insulating film 37 formed on the second surface 32b of the base substrate 32. Further, the base substrate 32 includes a through hole 51 penetrating the base substrate 32 in the Z direction, which is a thickness direction. The through hole 51 is filled with a conductive material to form a through electrode 52. Therefore, the wiring 36 formed on the first surface 32a of the base substrate 32 and the external coupling terminal 50 formed on the second surface 32b of the base substrate 32 can be electrically coupled via the through electrode 52.

The resonator element 60 accommodated in the internal space 57 includes a quartz crystal substrate 61, an excitation electrode 62 that vibrates the quartz crystal substrate 61, a coupling terminal 63 that outputs a resonator signal to the outside and fixes the resonator element 60 to the first package 31, and a lead electrode (not shown) that electrically couples the excitation electrode 62 and the coupling terminal 63.

The resonator element 60 is disposed and fixed on the first surface 32a of the first package 31 via the conductive member 72 such as the metal bump. A state in which the resonator element 60 is fixed to the first package 31 means that the internal coupling terminal 49 formed on the base substrate 32 of the first package 31 and the coupling terminal 63 formed on the quartz crystal substrate of the resonator element 60 are mechanically and electrically bonded to each other via the conductive member 72. As the quartz crystal substrate 61, an AT-cut quartz crystal substrate, an SC-cut quartz crystal substrate, a BT-cut quartz crystal substrate, or the like is used.

Similarly to the base substrate 32, the lid 33 is a silicon substrate. Accordingly, a linear expansion coefficient of the base substrate 32 and a linear expansion coefficient of the lid 33 are equal to each other, the generation of thermal stress due to thermal expansion is prevented, and the oscillator 30 having excellent resonator characteristics is obtained. Since the oscillator 30 can be formed by a semiconductor process, the oscillator 30 can be manufactured with high accuracy, and a size of the oscillator 30 can be reduced. The lid 33 is not particularly limited, and a semiconductor substrate other than a silicon substrate, for example, a semiconductor substrate such as a germanium substrate, a gallium arsenide substrate, a gallium phosphide substrate, a gallium nitride substrate, or a silicon carbide substrate may be used. For example, a substrate other than a semiconductor substrate such as a metal substrate such as Kovar, and a glass substrate may be used.

The lid 33 includes a bottomed recess 56 that opens on a side opposite from an outer surface 55, which is an upper surface of the lid 33, and accommodates the resonator element 60 therein. A lower surface of the lid 33 is bonded to the first surface 32a of the base substrate 32 via a bonding member 34. Accordingly, the lid 33 forms, together with the base substrate 32, the internal space 57 for accommodating the resonator element 60. As a bonding method of the base substrate 32 and the lid 33, a bonding method such as diffusion bonding using diffusion of metals contained in the base substrate 32 and the lid 33 instead of using the bonding member 34 may be used.

The internal space 57 is airtight and is in a depressurized state, preferably in a state closer to vacuum. Accordingly, viscous resistance is reduced, and oscillation characteristics of the resonator element 60 are improved. However, an atmosphere of the internal space 57 is not particularly limited, and may be, for example, an atmosphere in which an inert gas such as nitrogen or argon is sealed, or may be an atmospheric pressure state or a pressurized state instead of the depressurized state.

Next, a configuration of the integrated circuit 40 will be described with reference to FIG. 4.

Figure 4:
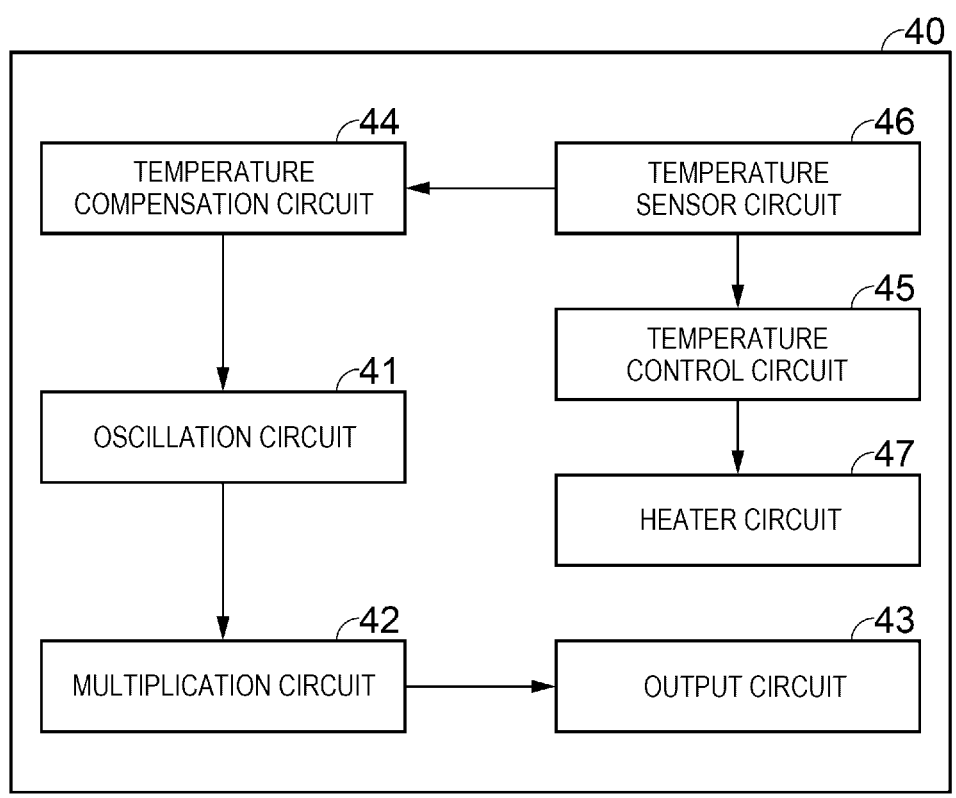
FIG. 4 is a functional block diagram of an integrated circuit.

As shown in FIG. 4, the integrated circuit 40 according to the present embodiment includes an oscillation circuit 41, a multiplication circuit 42, an output circuit 43, a temperature compensation circuit 44, a temperature control circuit 45, the temperature sensor circuit 46, and the heater circuit 47.

The oscillation circuit 41 is electrically coupled to the resonator element 60, amplifies an output signal of the resonator element 60, and feeds back the amplified signal to the resonator element 60, thereby causing the resonator element 60 to oscillate. The multiplication circuit 42 multiplies a frequency signal output from the oscillation circuit 41. The output circuit 43 outputs the multiplied frequency signal from the external coupling terminals 50 to the outside.

The temperature compensation circuit 44 performs temperature compensation based on temperature information output from the temperature sensor circuit 46 such that frequency variation of an oscillation signal of the oscillation circuit 41 is smaller than frequency-temperature characteristics of the resonator element 60 itself. Accordingly, excellent temperature characteristics can be exhibited. The temperature compensation circuit 44 may, for example, adjust an oscillation frequency of the oscillation circuit 41 by adjusting a capacitance of a variable capacitance circuit coupled to the oscillation circuit 41, or adjust a frequency of an output signal of the oscillation circuit 41 by a Phase Locked Loop (PLL) circuit or a direct digital synthesizer circuit.

The temperature control circuit 45 is a circuit that maintains the resonator element 60 at a constant temperature by controlling an amount of current flowing through the heater circuit 47 based on the temperature information output from the temperature sensor circuit 46. For example, when a current temperature determined based on an output signal of the temperature sensor circuit 46 is lower than a set reference temperature, the temperature control circuit 45 performs control such that a desired current flows through the heater circuit 47, and when the current temperature is higher than the reference temperature, the temperature control circuit 45 performs control such that the current does not flow through the heater circuit 47.

For example, the temperature control circuit 45 may perform control to increase or decrease an amount of current flowing through the heater circuit 47 according to a difference between the current temperature and the reference temperature. Here, the temperature sensor circuit 46 serves as both a temperature sensor for the temperature compensation circuit 44 and a temperature sensor for the temperature control circuit 45. Therefore, the number of components is reduced, and the size of the oscillator 30 can be reduced. However, the present embodiment is not limited thereto, and a temperature sensor for the temperature compensation circuit 44 and a temperature sensor for the temperature control circuit 45 may be provided separately.

The temperature sensor circuit 46 is an element that detects a temperature, and can be formed by providing a Si diode or a PNP transistor in the integrated circuit 40. By forming platinum, the temperature can be detected based on characteristics in which a resistance value changes as the temperature changes. The temperature sensor circuit 46 is disposed at a position overlapping the resonator element 60 in a plan view from the Z direction.

The heater circuit 47 is a heat generating element, is formed by providing a resistor made of an indium tin oxide (ITO) in the integrated circuit 40, generates heat when being energized, and is capable of adjusting an amount of heat generation by adjusting a current flowing through the resistor. The heater circuit 47 is disposed at a position overlapping the resonator element 60 in the plan view from the Z direction.

As described above, in the resonator device 1 according to the present embodiment, the resonator element 60 is accommodated in the first package 31 which has high thermal conductivity and in which the heater circuit 47 is formed, and thus the heat of the heater circuit 47 is transferred to the resonator element 60 by heat radiation from the entire first package 31 heated by the heater circuit 47, so that temperature unevenness in the resonator element 60 can be prevented. Since the temperature sensor circuit 46 is provided in the first package 31, a temperature difference between the resonator element 60 and the temperature sensor circuit 46 is prevented, temperature control is performed with high accuracy, and accuracy of an oscillation frequency output from the resonator device 1 can be improved.

Since the conductive member 72 such as the metal bump is used for electrical coupling between the first package 31 and the second package 10, a size of the resonator device 1 can be reduced as compared with a case in which a bonding wire is used.

2. Second Embodiment

Next, a resonator device 1a according to a second embodiment will be described with reference to FIG. 5.

When compared with the resonator device 1 according to the first embodiment, the resonator device 1a according to the present embodiment is the same as the resonator device 1 according to the first embodiment except that a position of the first package 31 bonded to a first substrate 13 of a second package 10a is different, and the external coupling terminals 50 and coupling terminals 14a are respectively electrically coupled via conductive wires 72a. Differences from the first embodiment described above will be mainly described, the same elements will be denoted by the same reference numerals, and description thereof will be omitted.

Figure 5:
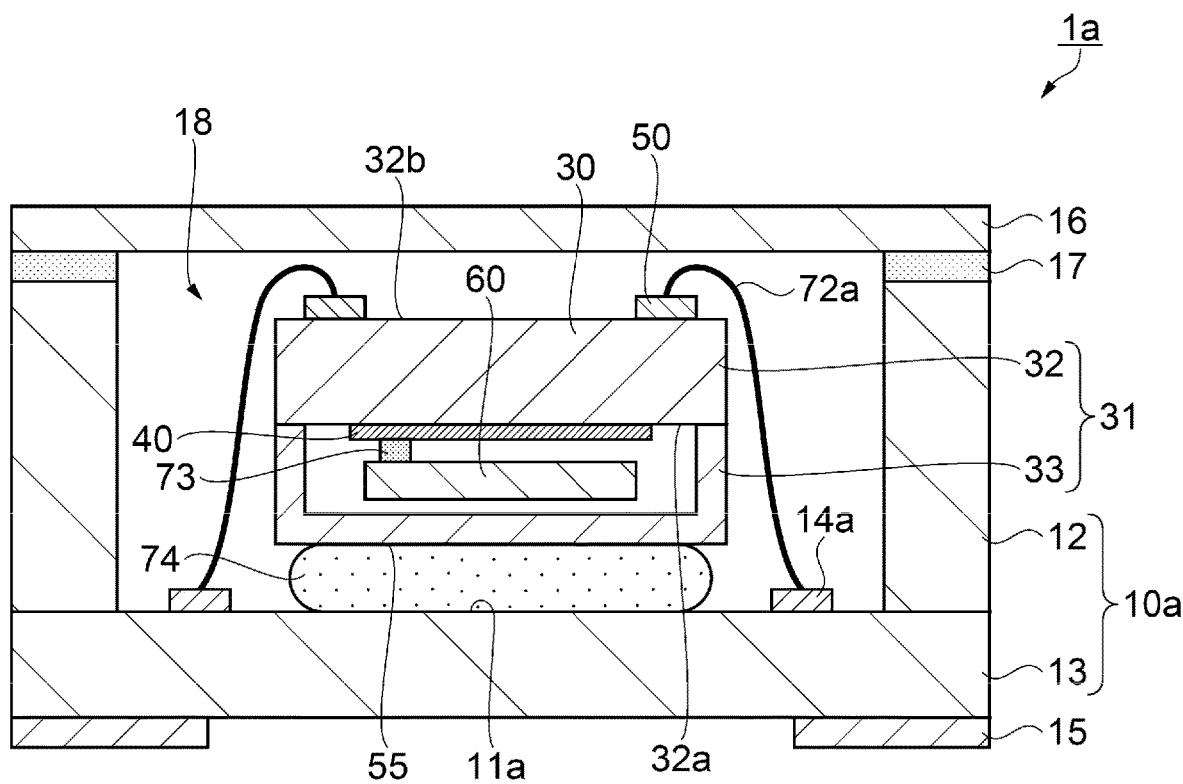
FIG. 5 is a cross-sectional view showing a schematic structure of a resonator device according to a second embodiment.

As shown in FIG. 5, in the resonator device 1a, the outer surface 55 of the lid 33 of the first package 31 and a bonding surface 11a of the first substrate 13 of the second package 10a are mechanically coupled to each other via a bonding member 74. That is, the first package 31 is fixed to the bonding surface 11a in a vertically reversed manner as compared with that of the resonator device 1 according to the first embodiment. The external coupling terminals 50 formed on the second surface 32b of the first package 31 and the coupling terminals 14a formed on the bonding surface 11a of the first substrate 13 are respectively electrically coupled via the conductive wires 72a.

With such a configuration, the base substrate 32 on which the heater circuit 47 is formed can be kept away from a bonding portion between the first package 31 and the second package 10a, so that the first package 31 can be effectively heated, the influence of an external temperature fluctuation on the temperature sensor circuit 46 can be prevented, and the same effects as those of the resonator device 1 according to the first embodiment can be achieved.

3. Third Embodiment

Next, a resonator device 1b according to a third embodiment will be described with reference to FIG. 6.

When compared with the resonator device 1 according to the first embodiment, the resonator device 1b according to the present embodiment is the same as the resonator device 1 according to the first embodiment except that a position of the first package 31 bonded to a first substrate 13b of a second package 10b is different, the external coupling terminals 50 and coupling terminals 14b are respectively electrically coupled via conductive wires 72b, and a heat insulating member 80 is provided between the first package 31 and the first substrate 13b of the second package 10b. Differences from the first embodiment described above will be mainly described, the same elements will be denoted by the same reference numerals, and description thereof will be omitted.

Figure 6:
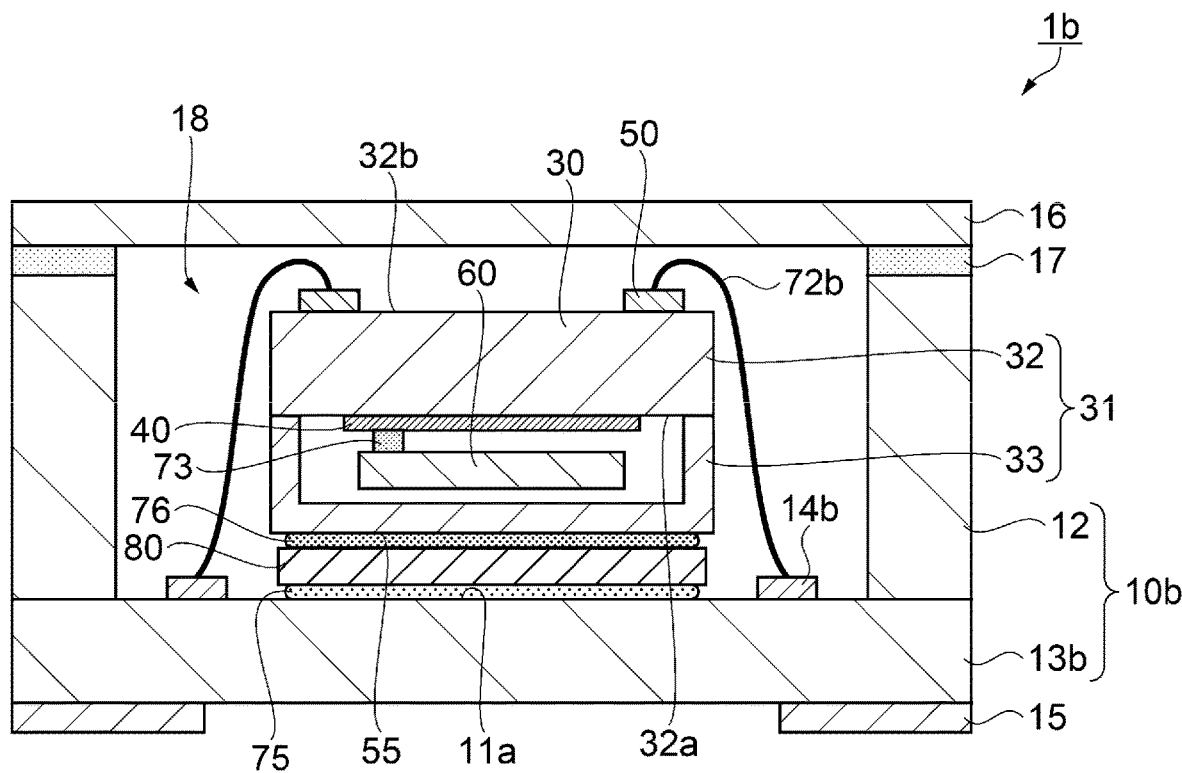
FIG. 6 is a cross-sectional view showing a schematic structure of a resonator device according to a third embodiment.

As shown in FIG. 6, in the resonator device 1b, the heat insulating member 80 is provided between the outer surface 55 of the lid 33 of the first package 31 and the bonding surface 11a of the first substrate 13b of the second package 10b. The heat insulating member 80 is fixed to the first substrate 13b via a bonding member 75, and the first package 31 is fixed on the heat insulating member 80 via a bonding member 76. The external coupling terminals 50 formed on the second surface 32b of the first package 31 and the coupling terminals 14b formed on the bonding surface 11a of the first substrate 13b are respectively electrically coupled via the conductive wires 72b.

The heat insulating member 80 is made of a material having thermal conductivity lower than that of the second package 10b. The heat insulating member 80 is not particularly limited, for example, various resin materials, particularly, a porous resin material such as porous polyimide can be used as the heat insulating member 80, and in addition to the resin materials, various glass materials, inorganic porous materials such as silica aerogel, and the like can be used. The thermal conductivity of the heat insulating member 80 is not particularly limited, and is preferably 1.0 W/m K or less. Accordingly, the heat insulating member 80 having sufficiently low thermal conductivity is obtained.

The heat insulating member 80 may include a gap material having sufficiently low thermal conductivity, such as silica gel. Accordingly, a thickness of the heat insulating member 80 can be controlled, and a heat insulating effect may be more reliably exhibited.

With such a configuration, the heat of the heater circuit 47 formed in the integrated circuit 40 of the first package 31 can be sufficiently prevented from being transferred to the second package 10b, and the same effects as those of the resonator device 1 according to the first embodiment can be achieved.

What is claimed is:

1. A resonator device, comprising:
   a resonator element;
   a first package that accommodates the resonator element; and
   a second package in which the first package is accommodated and fixed, wherein
   the first package includes
      a base substrate that has a first surface on which the resonator element is disposed and a second surface which is in a front-back relationship with the first surface, and that contains single crystal silicon,
      an integrated circuit that is provided on the first surface or the second surface and that includes a temperature sensor circuit and a heater circuit,
      a wirings that is provided on the first surface of the base substrate,
      an internal coupling terminal that is provided on the integrated circuit and electrically coupled to the wiring,
      an external coupling terminal that is provided on the second surface of the base substrate,
      a through electrode configured by filling a conductive material in a through hole penetrating from the first surface to the second surface of the base substrate, and
      a lid that is bonded to the base substrate such that the resonator element is accommodated between the lid and the base substrate, wherein
   the resonator element is disposed on the integrated circuit and bonded to the internal coupling terminal, and
   the wiring and the external coupling terminal are electrically coupled via the through electrode.

2. The resonator device according to claim 1, wherein thermal conductivity of the first package is higher than thermal conductivity of the second package.

3. The resonator device according to claim 1, wherein
   the second package includes a coupling terminal on a bonding surface thereof to which the first package is bonded, and
   the external coupling terminal and the coupling terminal are mechanically and electrically bonded to each other via a conductive member.

4. The resonator device according to claim 1, wherein
   the second package includes a coupling terminal on a bonding surface thereof to which the first package is bonded,
   the external coupling terminal and the coupling terminal are electrically coupled to each other via a conductive wire, and
   an outer surface of the lid and the bonding surface of the second package are mechanically coupled to each other via a bonding member.

5. The resonator device according to claim 1, wherein the first package is fixed to the second package via a heat insulating member.

* * * * *